(12) United States Patent
Lee et al.

(10) Patent No.: US 6,924,002 B2
(45) Date of Patent: Aug. 2, 2005

(54) COATING AND COATING PROCESS INCORPORATING RAISED SURFACE FEATURES FOR AN AIR-COOLED SURFACE

(75) Inventors: Ching-Pang Lee, Cincinnati, OH (US); Robert Edward Schafrik, Cincinnati, OH (US); Ramgopal Darolia, West Chester, OH (US); Joseph David Rigney, Milford, OH (US)

(73) Assignee: General Electric Company, Schenectady, NY (US)

( * ) Notice: Subject to any disclaimer, the term of this patent is extended or adjusted under 35 U.S.C. 154(b) by 109 days.

(21) Appl. No.: 10/248,846

(22) Filed: Feb. 24, 2003

(65) Prior Publication Data

US 2004/0166355 A1 Aug. 26, 2004

(51) Int. Cl.$^7$ .............................................. C23C 16/06
(52) U.S. Cl. .................... 427/252; 427/255.7; 427/282; 427/448; 427/456
(58) Field of Search .............................. 427/252, 255.7, 427/282, 448, 456

(56) References Cited

U.S. PATENT DOCUMENTS

| | | | |
|---|---|---|---|
| 5,353,865 A | 10/1994 | Adiutori et al. ............ 165/133 |
| 5,419,971 A | * 5/1995 | Skelly et al. ............... 428/612 |
| 5,630,879 A | 5/1997 | Eichmann et al. .......... 118/720 |
| 5,993,904 A | 11/1999 | Boucher ................... 427/248.1 |
| 6,254,997 B1 | * 7/2001 | Rettig et al. ................ 428/553 |
| 6,322,671 B1 | * 11/2001 | Mingazhev .............. 204/192.1 |
| 6,387,527 B1 | 5/2002 | Hasz et al. ................. 428/472 |
| 6,402,464 B1 | 6/2002 | Chiu et al. ................. 415/116 |
| 6,444,331 B2 | 9/2002 | Ritter et al. ................ 428/553 |
| 6,468,669 B1 | 10/2002 | Hasz et al. ................. 428/553 |
| 6,499,949 B2 | 12/2002 | Schafrik et al. .......... 416/97 R |
| 6,503,574 B1 | 1/2003 | Skelly et al. ............... 427/446 |
| 6,505,673 B1 | 1/2003 | Abauf et al. ................. 164/45 |

* cited by examiner

*Primary Examiner*—Bret Chen
(74) *Attorney, Agent, or Firm*—David L. Narciso; Gary M. Hartman; Domenica N.S. Hartman

(57) ABSTRACT

A coating and coating process for incorporating surface features on an air-cooled substrate surface of a component for the purpose of promoting heat transfer from the component. The coating process generally comprises depositing a first metallic coating material on the surface of the component using a first set of coating conditions to form a first environmental coating layer, and then depositing a second metallic coating material using a second set of coating conditions that differ from the first set, such that an outer environmental coating layer is formed having raised surface features that cause the surface of the outer environmental coating layer to be rougher than the surface of the first environmental coating layer.

24 Claims, 1 Drawing Sheet

COATING AND COATING PROCESS INCORPORATING RAISED SURFACE FEATURES FOR AN AIR-COOLED SURFACE

BACKGROUND OF INVENTION

1. Field of the Invention

The present invention generally relates to components subjected to high operating temperatures, such as gas turbine engine components. More particularly, this invention relates to a coating and coating process for incorporating surface features on an air-cooled surface of a component for the purpose of promoting heat transfer from the component.

2. Description of the Related Art

Higher operating temperatures for gas turbine engines are continuously sought in order to increase their efficiency. However, as operating temperatures increase, the high temperature properties of the engine components must correspondingly increase. While significant advances have been achieved through formulation of iron, nickel and cobalt-base superalloys, the high temperature properties of such alloys are often insufficient to withstand long exposures to operating temperatures within the turbine, combustor and augmentor sections of some high-performance gas turbine engines. As a result, forced air cooling is often employed, alone or in combination with an environmental coating or a thermal barrier coating (TBC) system that, respectively, environmentally or thermally protects the component surfaces. In a typical cooling scheme, air is drawn from the engine compressor and flowed through or directed at surfaces of a component. In a technique known as backside air flow, jets of air are directed to impinge surfaces of a component that are not directly exposed to the high temperature combustion gases, e.g., the backside of a component.

The performance of a turbine component is directly related to the ability to achieve a generally uniform surface temperature with a limited amount of cooling air. In terms of the heat transfer mechanism, the performance of a conventional impingement-cooled surface is a function of the flow mechanism on the surface, the wetted surface area, and the temperature difference between the fluid and the surface. To promote uniform convective cooling of a component surface, it is conventional to increase the surface heat transfer coefficient of the cooled surface by forming heat transfer enhancement features, such as protuberances or bumps referred to as turbulators, on the surfaces of the component that require cooling. The size, shape and placement of turbulators affect the heat transfer rate from a component surface, and therefore affect the extent to which the service temperature of a component is reduced. Turbulators have been formed during casting of components, as taught in commonly-assigned U.S. Pat. No. 5,353,865 to Adiutori et al. However, casting techniques are limited in their ability to form dense patterns of small turbulators, which are desirable for backside air cooling because a single air jet is then able to impinge multiple turbulators. Furthermore, casting cannot be used to add, repair or modify turbulators on a component already in service.

Another approach to forming turbulators is a brazing technique taught by commonly-assigned U.S. Pat. No. 6,484,669 to Hasz et al., in which metallic particles are brazed to an air-cooled surface. This technique is able to achieve a good heat transfer enhancement in view of the ability to use small particles placed close together. However, if one were to deposit an environmental coating on the cooled surface to protect the component from hot corrosion and oxidation, the spaces between the brazed particles become filled with the coating material, thereby reducing the surface area enhancement. This problem is avoided by a method taught by commonly-assigned U.S. Pat. No. 6,254,997 to Rettig et al., in which an environmental overlay coating of MCrAlY (where M is iron, cobalt or iron) is deposited by electric arc wire thermal spraying. According to Rettig et al., an electric arc spray process is capable of depositing a relatively rough coating, preferably an average surface roughness (Ra) of greater than about 500 microinches (about 13 micrometers), which promotes heat transfer from the coated surface.

While improvements in cooling efficiency have been achieved with the above techniques, further enhancements in processing and thermal efficiency would be desirable.

SUMMARY OF INVENTION

The present invention provides a coating and coating process for incorporating surface features on an air-cooled surface of a component for the purpose of promoting heat transfer from the component. The coating process generally comprises depositing a first metallic coating material on the surface of the component using a first set of coating conditions to form a first environmental coating layer, and then depositing a second metallic coating material on the surface of the first environmental coating layer using a second set of coating conditions that differ from the first set, forming a second environmental coating layer that has raised surface features which cause the surface of the second environmental coating layer to be rougher than the surface of the first environmental coating layer. As such, the coating of this invention comprises two discrete environmental coating layers, one on top of the other, with different physical characteristics, with the outer (second) layer defining the outermost surface of the component. The first environmental coating layer is deposited in a manner that promotes its environmental protection capability for the component, while the second environmental coating layer is deposited in a manner that promotes cooling of the component surface as a result of the increased surface roughness attributed to the raised surface features.

According to a preferred aspect of the invention, both the first and second environmental coating layers are a diffusion aluminide, beta-phase NiAl, or a gamma-prime MCrAlX (where M is nickel, cobalt and/or iron, and X is yttrium or another rare earth or reactive element), such as NiCoCrAlY. Because of the excellent environmental properties of these materials, a separate environmental coating is not required to protect the surface of the component on which the first and second environmental coating layers were deposited. According to another aspect of the invention, the different coating conditions used to deposit the coating layers can be brought about in various ways. In one embodiment, the second environmental coating layer is formed by depositing the second metallic coating material through a masking screen, such that the raised surface features of the second environmental coating layer are formed by depositing the second metallic coating material through openings in the masking screen. An advantage of this approach is that the raised surface features can be selectively formed in certain regions of the second environmental coating layer, and these surface features can be readily sized so that multiple surface features are impinged by a single impingement jet. Alternatively, the second environmental coating layer can be formed by depositing coarse particles of the second metallic coating material, with the particles being sufficiently large to cause the second environmental coating layer to have the desired raised surface features. This approach is particularly well suited for depositing coatings formed of beta-phase nickel aluminide, which has a thermal conductivity significantly higher than many superalloy coating materials.

In view of the above, the present invention enables small surface features to be selectively formed in dense patterns that allow a single air jet to impinge multiple turbulators, thus promoting cooling efficiency. Furthermore, the surface features can be added, repaired and modified on a component returned from service. Finally, because the surface features are defined by an environmentally-resistive coating material, the present invention eliminates the need to deposit an environmental coating over the raised surface features, which could reduce the surface area enhancement sought with the surface features.

Other objects and advantages of this invention will be better appreciated from the following detailed description.

DETAILED DESCRIPTION

Figure 1:
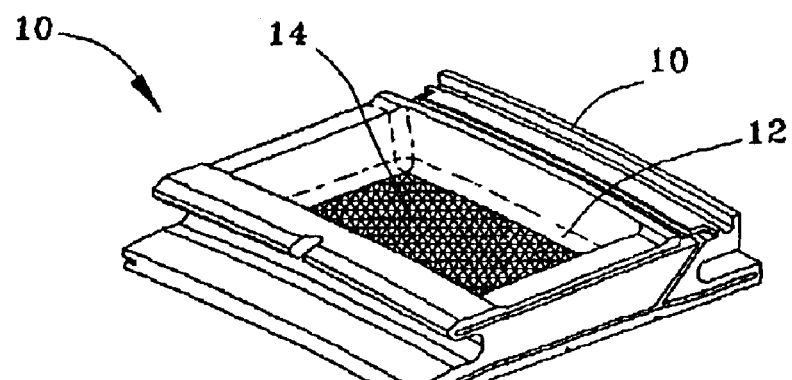
FIG. 1 is a perspective view of a gas turbine engine shroud having raised backside surface features.

The present invention provides coatings and coating processes for promoting heat transfer from a surface of a component. FIG. 1 represents a turbine shroud 10 for a gas turbine engine, and depicts the backside surface of the shroud 10 being equipped with multiple raised surface features 14. In FIG. 1, the surface features 14 are in the form of distinct turbulators that are illustrated as being of a particular size and shape. However, surface features 14 can be selectively formed in accordance with this invention to have a variety of sizes and shapes suitable for promoting heat transfer. In addition, while the Figures and discussion below are directed to a gas turbine engine component, the invention can find use in a variety of other applications in which enhanced surface cooling through the presence of raised surface features is desired.

Figure 2:
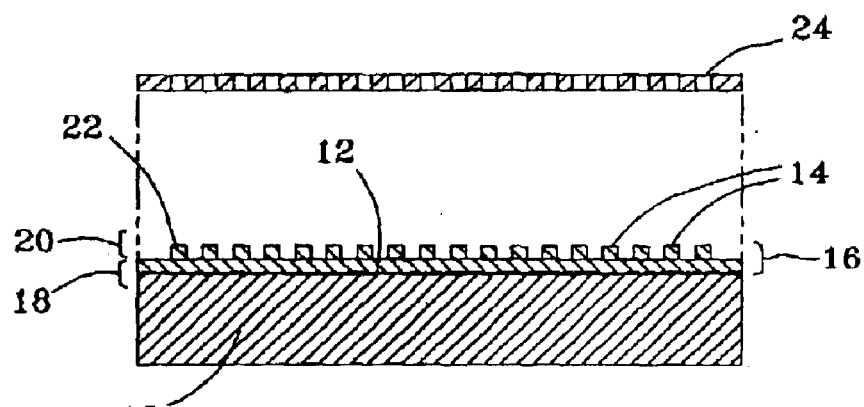
FIG. 2 is a fragmentary cross-sectional view of a gas turbine engine component having a two-layer environmental coating system, in which the outermost layer is deposited through a screen mask to define raised surface features in accordance with a first embodiment of this invention.
Figure 3:
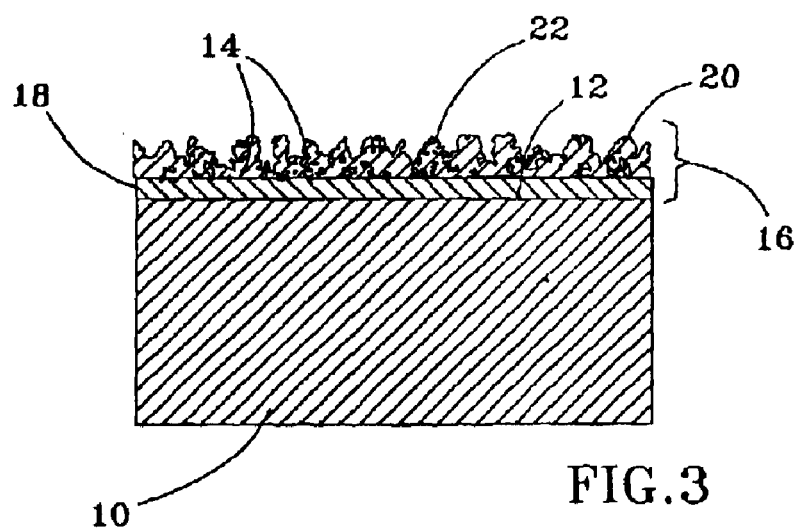
FIG. 3 is a fragmentary cross-sectional view of a gas turbine engine component having a two-layer environmental coating system, in which the outermost layer is formed by depositing coarse particles that define raised surface features in accordance with a second embodiment of this invention.

FIGS. 2 and 3 depict two approaches for producing raised surface features 14 on a substrate surface 12, such as the backside surface of the shroud 10 shown in FIG. 1. In each case, the surface features 14 are formed of an environmentally-resistant coating material, which is defined herein as a material that environmentally protects a surface from oxidation and hot corrosion through the slow growth of a strong, adherent and continuous oxide scale, typically alumina. As such, additional environmental coatings are not required to protect the surface 12 from a hostile environment. Surface features 14 formed in accordance with this invention are provided by a coating system 16 that comprises a smooth and dense first layer 18 that seals the surface 12 from oxidation and corrosion, and an outer layer 20 whose outer surface 22 defines the raised surface features 14. Such a coating system 16 can be deposited in a two-step process, by which the first layer 18 is deposited directly on the substrate surface 12, and the outer layer 20 is deposited directly on the first layer 18. In a first approach represented by FIG. 2, the surface features 14 are generally in the form of distinct turbulators in a set pattern, while the surface features 14 represented in FIG. 3 are defined by generally random peaks in the outer layer 20.

With reference to FIG. 2, the outer layer 20 of the coating system 16 is defined entirely by the raised surface features 14 rising from the surface of the underlying first layer 18, which is essentially free of any surface features 14. In this approach, the first layer 18 is deposited using a conventional coating technique for the chosen coating material, e.g., depositing aluminum by vapor phase (gas phase) aluminiding (VPA) or chemical vapor deposition (CVD) to form a diffusion aluminide (including PtAl) coating, or depositing a beta-phase NiAl or gamma-prime MCrAlX overlay coating by a physical vapor deposition (PVD) technique, such as electron beam physical vapor deposition (EBPVD), sputtering or cathodic arc. The first layer 18 is typically smooth in the as-deposited condition, and is required to be sufficiently dense to seal the surface 12 from oxidation and hot corrosion. If a diffusion coating or deposited by PVD, the first layer 18 will generally be sufficiently dense in the as-deposited condition for purposes of this invention. A suitable thickness for the first layer 18 is about 15 to about 100 micrometers, though lesser and greater thicknesses are foreseeable.

The outer layer 20 is then deposited through a shadowing masking screen 24 that is positioned above the first layer 18. Techniques capable of depositing the outer layer 20 through the screen 24 are overlay coating processes, including PVD and thermal spray techniques, such as plasma spraying (air, vacuum and low pressure), high velocity oxy-fuel (HVOF), and electric wire arc. If the first layer 18 was also deposited as an overlay coating by PVD, the outer layer 20 can be deposited using the same coating material and the same deposition parameters (aside from the screen) employed to deposit the first layer 18. In FIG. 2, the surface features 14 can be seen as having been deposited as distinct columns through the screen 24, with the column height effectively establishing the thickness of the outer layer 20. The column height (normal to the surface of the first layer 18), as well as column width, cross-sectional shape and spacing, can be tailored for the conditions to which the substrate 12 (e.g., the shroud 10 of FIG. 1) will be exposed. A suitable column height and width is about 0.004 inch to about 0.025 inch (about 100 to about 625 micrometers), while a suitable spacing between surface features 14 is about 0.004 inch to about 0.025 inch (about 100 to about 625 micrometers). The cross-sectional shape of the columns can be square, rectangular, circular, oval, etc.

The surface features 14 of the coating system 16 represented in FIG. 2 are capable of enhancing the surface area exposed to cooling air flow, thus enhancing the heat transfer rate from the surface 12. By appropriately sizing the openings in the mask 2, the surface features 14 can be deposited through the mask 24 to be much smaller than the diameter of impingement jets (about 0.020 to about 0.040 inch (about 0.5 to about 1 mm)) typically found with backside cooling schemes of the type often used for cooling the shroud 10 of FIG. 1. Sizing the surface features 14 to be smaller than an impinging air jet enables multiple surface features 14 to be impacted by the same jet, which improves cooling efficiency. Furthermore, because the surface features 14 are formed of an oxidation and corrosion-resistant material, the rough surface 22 of the layer 20 defined by the surface features 14 does not require any additional environmental coating.

As represented in FIG. 3, the underlying first layer 18 of the coating system 16 is again dense and smooth, while the surface 22 of the outer layer 20 is intentionally rough as a result of the presence of raised surface features 14. At least the outer layer 20, and preferably both layers 18 and 20 of the coating system 16, are formed by depositing particles of a suitable coating material, preferably beta-phase NiAl. To produce the surface features 14, the outer layer 20 is deposited from sufficiently coarse particles that result in the outer layer 20 being rougher than the first layer 18, as well as less dense than the first layer 18 as a result of increased interparticle gaps. The first layer 18 of this embodiment can be deposited by EBPVD, cathodic arc or thermal spraying. If deposited by thermal spraying a particulate coating material, a preferred average particle size is less than 100 micrometers, such as in a range of about 15 to about 125 micrometers, with a preferred average particle size being about 75 micrometers or less. When formed of beta-phase NiAl particles within this size range, the first layer 18 is sufficiently dense to seal the surface 12. A suitable thickness for the first layer 18 is about 15 to about 100 micrometers, though lesser and greater thicknesses are again foreseeable.

The outer layer 20 is then deposited using the coarse coating material, preferably with an average particle size of at least 100 micrometers in order to inhibit filling of interparticle gaps. For example, particles with a size range of about 88 to about 149 micrometers and an average particle size of about 100 micrometers or more are suitable for the outer layer 20. If both layers 18 and 20 are deposited by thermal spraying particulate materials, the outer layer 20 can be deposited using the same deposition parameters employed to deposit the first layer 18. In contrast to the embodiment of FIG. 2, the surface features 14 formed by the process of this embodiment are defined by generally random, irregularly-shaped peaks formed by the large particles from which the outer layer 20 was deposited. To promote their thermal efficiency, the surface features 14 of the outer layer 20 preferably have a height of at least 100 micrometers. A suitable overall thickness for the outer layer 20 (measured to the peaks of the surface features 14) is generally about 100 to about 375 micrometers.

As a result of being formed of beta-phase NiAl, the coating system 16 represented in FIG. 3 is highly conductive (about three times more conductive than typical superalloys). Consequently, a significant advantage of this embodiment is that the coating system 16 is more thermally conductive, such that heat is more readily conducted through the coating 16 to the surface features 14, where heat transfer by forced convection takes place. In addition to impingement cooling used in a backside cooling scheme used in turbine shrouds and nozzle bands, the rough surface 22 of the outer layer 20 also has cooling characteristics effective for use on convection cooled surfaces, such as combustor liners. Finally, as with the embodiment of FIG. 2, the excellent environmental properties of the coating material used to define the coating system 16 of FIG. 3 eliminates the need for an additional environmental coating to protect the surface 12.

While the invention has been described in terms of a preferred embodiment, it is apparent that other forms could be adopted by one skilled in the art. Therefore, the scope of the invention is to be limited only by the following claims.

What is claimed is:

1. A process of forming raised surface features on a surface of a component for promoting heat transfer from the surface, the process comprising the steps of:

depositing a first metallic coating material on the surface of the component using a first set of coating conditions to form a first environmental coating layer having an outer surface; and depositing a second metallic coating material using a second set of coating conditions to form an outer environmental coating layer, the second set of coating conditions differing from the first set of coating conditions such that depositing the outer environmental coating layer is deposited to have raised surface features that define a surface of the outer environmental coating layer that is rougher than the outer surface of the first environmental coating layer.

2. The process according to claim 1, wherein the first and second metallic coating materials are chosen from the group consisting of aluminum, gamma-prime MCrAlX, and beta-phase NiAl.

3. The process according to claim 1, wherein the first and outer environmental coating layers are chosen from the group consisting of diffusion aluminides, gamma-prime MCr-AlX, and beta-phase NiAl.

4. The process according to claim 1, wherein the first and outer environmental coating layers have substantially the same composition.

5. The process according to claim 1, wherein the outer environmental coating layer is formed by depositing the second metallic coating material through a masking screen, the raised surface features of the outer environmental coating layer being formed by portions of the second metallic coating material deposited through openings in the masking screen.

6. The process according to claim 5, wherein the raised surface features of the outer environmental coating layer project about 100 to about 625 micrometers beyond the outer surface of the first environmental coating layer, have a width of about 100 to about 625 micrometers in a direction parallel to the outer surface of the first environmental coating, and are spaced apart from each other about 100 to about 625 micrometers.

7. The process according to claim 5, wherein the raised surface features of the outer environmental coating layer have cross-sectional shapes chosen from the group consisting of square, rectangular, circular and oval.

8. The process according to claim 5, wherein the outer environmental coating layer defines the outermost surface of the component.

9. The process according to claim 1, wherein the outer environmental coating layer is formed by depositing particles of the second metallic coating material, the particles being sufficiently large to define the raised surface features of the outer environmental coating layer and to cause the outer environmental coating layer to be less dense than the first environmental coating layer.

10. The process according to claim 9, wherein at least some of the raised surface features of the outer environmental coating layer have a height of at least 100 micrometers.

11. The process according to claim 9, wherein the particles of the second metallic coating material have an average particle size of at least 100 micrometers.

12. The process according to claim 9, wherein the outer environmental coating layer defines the outermost surface of the component.

13. The process according to claim 1, further comprising the step of directing cooling air flow at the outer environmental coating layer so as to transfer heat from the component.

14. A process of forming turbulators on a substrate surface of a gas turbine engine component, the process comprising the steps of:

depositing a metallic coating material on the substrate surface of the component to form a first environmental coating layer having a substantially smooth surface; and then depositing the metallic coating material on the surface of the first environmental coating layer to form an outer environmental coating layer, the metallic coating material being deposited through openings in a masking screen so as to define raised turbulators on the outer environmental coating layer, the raised turbulators defining a surface of the outer environmental coating layer that is rougher than the surface of the first environmental coating layer, the outer environmental coating layer defining the outermost surface of the component.

15. The process according to claim 14, wherein the first and outer environmental coating layers are chosen from the group consisting of diffusion aluminides, gamma-prime MCrAlX, and beta-phase NiAl.

16. The process according to claim 14, wherein the raised turbulators of the outer environmental coating layer project about 100 to about 625 micrometers beyond the first environmental coating layer, have a width of about 100 to about 625 micrometers in a direction parallel to the surface of the first environmental coating, and are spaced apart from each other about 100 to about 625 micrometers.

17. The process according to claim 14, further comprising the step of directing cooling air flow at the outer environmental coating layer so as to transfer heat from the component.

18. A process of forming turbulators on a substrate surface of a gas turbine engine component, the process comprising the steps of:

depositing first particles of beta-phase nickel aluminide on the substrate surface of the component to form a first environmental coating layer having a substantially smooth surface; and then depositing second particles of beta-phase nickel aluminide on the surface of the first environmental coating layer to form an outer environmental coating layer, the second particles being larger than the first particles such that the outer environmental coating layer is less dense than the first environmental coating layer and the outer environmental coating layer has raised turbulators that define a surface of the outer environmental coating layer that is rougher than the surface of the first environmental coating layer, the outer environmental coating layer defining the outermost surface of the component.

19. The process according to claim 18, wherein at least some of the raised surface features of the outer environmental coating layer have a height of at least 100 micrometers.

20. The process according to claim 18, wherein the second particles have an average particle size of at least 100 micrometers and the first particles have an average particle size of not greater than 75 micrometers.

21. The process according to claim 18, further comprising the step of directing cooling air flow at the outer environmental coating layer so as to transfer heat from the component.

22. A process of forming raised surface features on a surface of a component for promoting beat transfer from the surface, the process comprising the steps of:

depositing a first metallic coating material on the surface of the component using a first set of coating conditions to farm a first environmental coating layer having an outer surface; and depositing a second metallic coating material using a second set of coating conditions to form an outer environmental coating layer, the second set of coating conditions differing from the first set of coating conditions such that the outer environmental coating layer has raised surface features that define a surface of the outer environmental coating layer that is rougher than the outer surface of the first environmental coating layer;

wherein the second set of coating conditions differ from the first set of coating conditions in regard to at least one of (a) the second metallic coating material being deposited through a masking screen and (b) the outer environmental coating layer being formed by depositing particles of the second metallic coating material that are sufficiently large to define the raised surface features and to cause the outer environmental coating layer to be less dense than the first environmental coating layer.

23. The process according to claim 22, wherein the first and outer environmental coating layers are chosen from the group consisting of diffusion aluminides, gamma-prime MCrAlX, and beta-phase NiAl.

24. The process according to claim 22, wherein the first and outer environmental coating layers have substantially the same composition.

\* \* \* \* \*